United States Patent
Hung et al.

(10) Patent No.: US 9,720,821 B2
(45) Date of Patent: Aug. 1, 2017

(54) ADAPTIVE COMPRESSION DATA STORING METHOD FOR NON-VOLATILE MEMORIES AND SYSTEM USING THE SAME

(71) Applicant: Storart Technology Co., Ltd., Hsinchu (TW)

(72) Inventors: Jui Hui Hung, Hsinchu (TW); Ming-Yi Chu, Hsinchu (TW)

(73) Assignee: Storart Technology Co. Ltd., Hsinchu (TW)

( * ) Notice: Subject to any disclaimer, the term of this patent is extended or adjusted under 35 U.S.C. 154(b) by 184 days.

(21) Appl. No.: 14/488,877

(22) Filed: Sep. 17, 2014

(65) Prior Publication Data
US 2016/0077960 A1 Mar. 17, 2016

(51) Int. Cl.
*G06F 12/02* (2006.01)
*H03M 7/30* (2006.01)

(52) U.S. Cl.
CPC ...... *G06F 12/0246* (2013.01); *H03M 7/3086* (2013.01); *G06F 2212/401* (2013.01)

(58) Field of Classification Search
None
See application file for complete search history.

(56) References Cited

U.S. PATENT DOCUMENTS

| | | | | |
|---|---|---|---|---|
| 2011/0252184 A1* | 10/2011 | Cho | ...... | G06F 3/0608 711/102 |
| 2011/0314235 A1* | 12/2011 | Kwon | ...... | G06F 3/0608 711/154 |
| 2011/0320915 A1* | 12/2011 | Khan | ...... | G06F 3/0608 714/773 |
| 2012/0102295 A1* | 4/2012 | Yang | ...... | G06F 12/023 711/206 |
| 2013/0326170 A1* | 12/2013 | Kilari | ...... | G06F 12/0246 711/161 |
| 2016/0011786 A1* | 1/2016 | Ninose | ...... | G06F 3/06 711/103 |

OTHER PUBLICATIONS

Microsoft Corporation, Microsoft Computer Dictionary Fifth Edition, Microsoft Press, 2002; pp. 182, 386, and 497.*

* cited by examiner

*Primary Examiner* — Mano Padmanabhan
*Assistant Examiner* — William E Baughman
(74) *Attorney, Agent, or Firm* — Che-Yang Chen; Law Offices of Scott Warmuth

(57) ABSTRACT

An adaptive compression data storing method for non-volatile memories and a system using the method are disclosed. The system includes a host interface unit, a data compressor, a padding unit, a buffer, a combining unit, and a mapping table unit. By combining some compressed data in one page, the present invention can settle the problem that space for storing a compressed data that can not be utilized. Further, lifetime of non-volatile memories can be extended.

17 Claims, 6 Drawing Sheets

ADAPTIVE COMPRESSION DATA STORING METHOD FOR NON-VOLATILE MEMORIES AND SYSTEM USING THE SAME

FIELD OF THE INVENTION

The present invention relates to an adaptive compression data storing method and a system using the method. More particularly, the present invention relates to an adaptive compression data storing method and a system using the method for non-volatile memories, such as flash memories.

BACKGROUND OF THE INVENTION

Due to continued scale-down of a NAND memory cell size combined with the use of multi-level cell (MLC) technology, Non-Volatile Memories (NVM), such as NAND flash-based solid-state drives (SSDs), have recently emerged as an attractive solution for consumer devices and desktop systems. As the density of flash memory cells increases, however, the performance and reliability of flash memory may deteriorate significantly. For example, single-level cell (SLC) flash memory fabricated with the 34 nm process allows a flash block to have 100,000 program/erase (P/E) cycles, whereas MLC flash memory at the same 34 nm process supports only 5,000 P/E cycles per block. The performance of MLC flash memory is also several times slower than that of SLC flash memory. Moreover, as the semiconductor process is further scaled down, it is expected that these problems will be getting worse. One of the promising approaches that can mitigate these problems is to use hardware accelerated compression.

Since the lifetime of flash-based SSDs strongly depends on the amount of data written to the SSDs, data compression, which reduces the actual amount of data written to the SSDs, can be an effective solution to improve the lifetime of the SSDs. Furthermore, if compression can be supported by a hardware acceleration unit, it can also improve the performance of SSDs because a smaller amount of data is physically transferred during I/O operations over uncompressed reads and writes. The idea of using data compression for data storage is not new and has been widely studied. For example, many existing file systems support software-based data compression to expand the effective capacity of a storage device. Although software-based compression approaches can be useful in improving the lifetime of SSDs, they incur a considerable compression/decompression overhead, thus the overall SSD performance deteriorates significantly. Therefore, software-based compression is usually employed when the storage capacity is one of the most important design goals.

Data compression refers to reducing the amount of space needed to store data or reducing the amount of time needed to transmit data. The size of data is reduced by removing the excessive information. The goal of data compression is to represent a source in digital form with as few bits as possible while meeting the minimum requirement of reconstruction of the original. Data compression can be lossless, only if it is possible to exactly reconstruct the original data from the compressed version. Such a lossless technique is used when the original data of a source are so important that we cannot afford to lose any details. Examples of such source data are medical images, text and images preserved for legal reason, some computer executable files, etc. Another family of compression algorithms is called lossy as these algorithms irreversibly remove some parts of data and only an approximation of the original data can be reconstructed. Approximate reconstruction may be desirable since it may lead to more effective compression. However, it often requires a good balance between the visual quality and the computation complexity. Data such as multimedia images, video and audio are more easily compressed by lossy compression techniques because of the way human visual and hearing systems work. Lossy algorithms achieve better compression effectiveness than lossless algorithms, but lossy compression is limited to audio, images, and video, where some loss is acceptable. The question of the better technique of the two, "lossless" or "lossy" is pointless as each has its own uses with lossless techniques better in some cases and lossy technique better in others.

There are quite a few lossless compression techniques nowadays, and most of them are based on dictionary or probability and entropy. In other words, they all try to utilize the occurrence of the same character/string in the data to achieve compression. The Dictionary based compression technique Lempel-Ziv scheme is divided into two families: those derived from LZ77 (LZ77, LZSS, LZH and LZB) and those derived from LZ78 (LZ78, LZW and LZFG).

One good example of hardware implementation with above compression techniques is provided by Sungjin Lee et al. in a paper titled "Improving Performance and Lifetime of Solid-State Drives Using Hardware-Accelerated Compression", published on IEEE Transactions on Consumer Electronics, Vol. 57, No. 4, November 2011. Please refer to FIG. 1. An SSD architecture 1 contains a Direct Memory Access (DMA) controller 10, a number of flash bus controllers 20, and a compression/decompression module 30. The DMA controller 20 receives commands from a host (not shown) and transfers data from/to a Dynamic Random Access Memory (DRAM) in the host. Each of the flash bus controller 20 performs several flash operations, including read, write, and erase operations, and moves the data from/to flash chips.

The compression/decompression module 30 is implemented between the DMA controller 10 and the flash bus controllers 20. The main role of the compression/decompression module 30 is to perform compression or decompression for the data being transferred from the DMA controller 10 or from the flash bus controllers 20, respectively. The compression/decompression module 30 uses the LZRW3 algorithm, a variant of the LZ77 algorithm. It has four hardware sub-modules: a shift register 21, a dictionary table 22, a compression logic 23, and a compression buffer 24. The shift register 21 holds the data to be tested for compression and the dictionary table 22 contains repeated patterns previously seen. The compression logic 23 converts the data in the shift register 21 to symbols by referring to the dictionary table 22. The compressed data, a sequence of symbols, are stored in the compression buffer 24 and moved eventually to a flash chip.

The compression/decompression module 30 fetches the data from a DMA buffer 11 in the DMA controller 10, which keeps the entire data sent from the host, until the shift register 21 is fully filled. The compression logic 23 creates a hash value using the first 3 bytes of the data in the shift register 21, which are used as a dictionary index for the dictionary table 22. The compression logic 23 then checks the data entry where the dictionary index points. If the first 3 bytes of the corresponding data entry is equivalent to those of the shift register 21, it is assumed that a matching pattern is found from the dictionary table 22. When the compression logic 23 finds a matching data entry, it compares the remaining bytes in the shift register 21 with those in the data entry and finds the common part of the data between the shift register 21 and the data entry. This common part is called a data segment. The compression logic 23 creates a symbol by combining the dictionary index and the length of the data segment, along with a compression flag whose value is '1'. The compression flag indicates if the symbol represents compressed data or uncompressed data. The symbol created is then written to the compression buffer 24. Finally, the whole data segment is discarded from the shift register 21, and the new data are transferred to the shift register 21 from the DMA buffer 11.

When a matching pattern is not found from the dictionary table 22, a symbol is created only for the first byte of the data. A 9-bit symbol is created by adding one-bit compression flag (whose value is 0) to the first byte of the shift register 21. After the symbol created is written to the compression buffer 24, a new byte of the data from the DMA buffer 11 is appended to the tail of the shift register 21, discarding the first byte of the shift register 21. Note that when a matching pattern is not available in the dictionary table 22, the old pattern in the data entry to which the hash value points is replaced by the new pattern in the shift register 21 for supporting newly found patterns.

With the SSD architecture 1, data written in a SSD is illustrated in FIG. 2. FIG. 2 shows consequent pages in the SSD. For those pages filled by slashes, it is indicated that all the storage units in these pages are written for a data stored. As to those pages partially filled by slashes, the blank portion contains no data and will technically padded by "0"s. The proportion of slashed area to the blank area is the proportion of storage units in the page written by a data to that with no data. Not all of the data can be compressed for their characteristics. FIG. 2 is an example for illustration purpose. From FIG. 2, it is clear that the physical page addresses P11 to P14 store an uncompressed data. Physical page addresses P15 and P16 store a compressed data. Physical page addresses P17 and P18 store another compressed data. Actually, the blanks in the pages are not only a waste of storage spaces, but also a reason to reduce lifetime of the SSD. All of the compression algorithms and the modules applied with the compression algorithms have similar defects indicated in the aforementioned prior art. Therefore, a method to utilize the blank area of a page and a system applies the method is desired.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

The present invention is provided to settle the problem that space for storing a compressed data can not be utilized. Further, lifetime of non-volatile memories can be extended.

One aspect of the present invention is to provide an adaptive compression data storing method for non-volatile memories. The method includes the steps of: A. receiving a first data, wherein a size of the first data is not greater than that of a page in a non-volatile memory and continuously received first data form an original data which needs to be stored in the non-volatile memory; B. dividing the first data into at least two basic units if the size of the first data is greater than a predetermined size, wherein at least one of the basic units is equal to the predetermined size; C. compressing the basic units or the first data; D. connecting and padding the compressed basic units or the first data to form one second data so that the second data has a size as an integral multiple of the predetermined size; E. storing the second data in a buffer; F. repeating step A to step E if the number of second data is 1 and the original data has not been received completely; G. searching for at least two of the second data that can be combined to have a size of one page in the buffer; H. combining the at least two of the second data in the buffer as a third data, or padding the second data or connecting and padding the second data in the buffer as a third data if the original data has been received completely, wherein a size of the third data is the same as that of one page; I. programming the third data to a specific page in the non-volatile memory; and J. processing step A if the original data has not been received completely. 0 is used as an element for padding.

Preferably, the adaptive compression data storing method further includes a step I1 after the step I: I1. updating a mapping table where a mapping connection for a physical page address of the specific page and a logical address of the original data is stored. The adaptive compression data storing method can also include a step H1 between the step H and the step I: H1. padding one second data which has the largest size among all second data in the buffer as the third data if the buffer is full or substantially full and no combination of the second data has the size as one page and programming the third data to a specific page in the non-volatile memory, wherein 0 is used as an element for padding. For settling the same issue, the adaptive compression data storing method can comprise a step H2 between the step H and the step I: H2. padding one second data which stays longer than other second data in the buffer as the third data if the buffer is full or substantially full and no combination of the second data has the size as one page and programming the third data to a specific page in the non-volatile memory, wherein 0 is used as an element for padding.

According to the present invention, a lossless compression algorithm is used in the step C for compressing the first data or the basic units. The lossless compression algorithm can be LZ77, LZSS, LZH, LZB, LZ78, LZW or LZFG. The non-volatile memory mentioned above is a NAND flash or a Solid-State Drive (SSD). One basic unit is compressed to form a compressed basic unit or at least two basic units are compressed to form a compressed basic unit.

Another aspect of the present invention is to provide adaptive compression data storing system for non-volatile memories. The system includes: a host interface unit, for communicating with a host and receiving first data having a size not greater than that of a page in a non-volatile memory from the host, wherein continuously received first data form an original data which needs to be stored in the non-volatile memory; a data compressor, electrically connected to the host interface unit, for dividing each first data into at least two basic units if the size of the first data is greater than a predetermined size, wherein at least one of the basic units is equal to the predetermined size; and compressing the basic units; a padding unit, electrically connected to the data compressor, for connecting and padding the compressed basic units to form one second data, and padding the second data or connecting and padding the second data as a third data if the original data has been received completely; a buffer, electrically connected with the padding unit and the non-volatile memory, for temporarily storing the second data, replacing one stored second data when it is full or substantially full, and programming the third data to a specific page in the non-volatile memory; and a combining unit, electrically connected with the buffer, for combining at least two of the second data in the buffer as a third data. If the size of the original data is not greater than the predetermined size, the first data will not be divided but be compressed and padded to a size of one page and programmed to the non-volatile memory. The second data has a size as an integral multiple of the predetermined size. The third data has a size the same as that of one page. 0 is used as an element for padding.

Preferably, the adaptive compression data storing system further includes a mapping table unit, electrically connected to the buffer, for storing and updating a mapping connection for a physical page address of the specific page and a logical address of the original data. The padding unit further pads one second data which has the largest size among all second data in the buffer as the third data if the buffer is full or substantially full and no combination of the second data has the size as one page. In order to settle the same problem, the padding unit can further pad one second data which stays longer than other second data in the buffer as the third data if the buffer is full or substantially full and no combination of the second data has the size as one page.

DETAILED DESCRIPTION OF THE PREFERRED EMBODIMENTS

The present invention will now be described more specifically with reference to the following embodiments.

Figure 1:
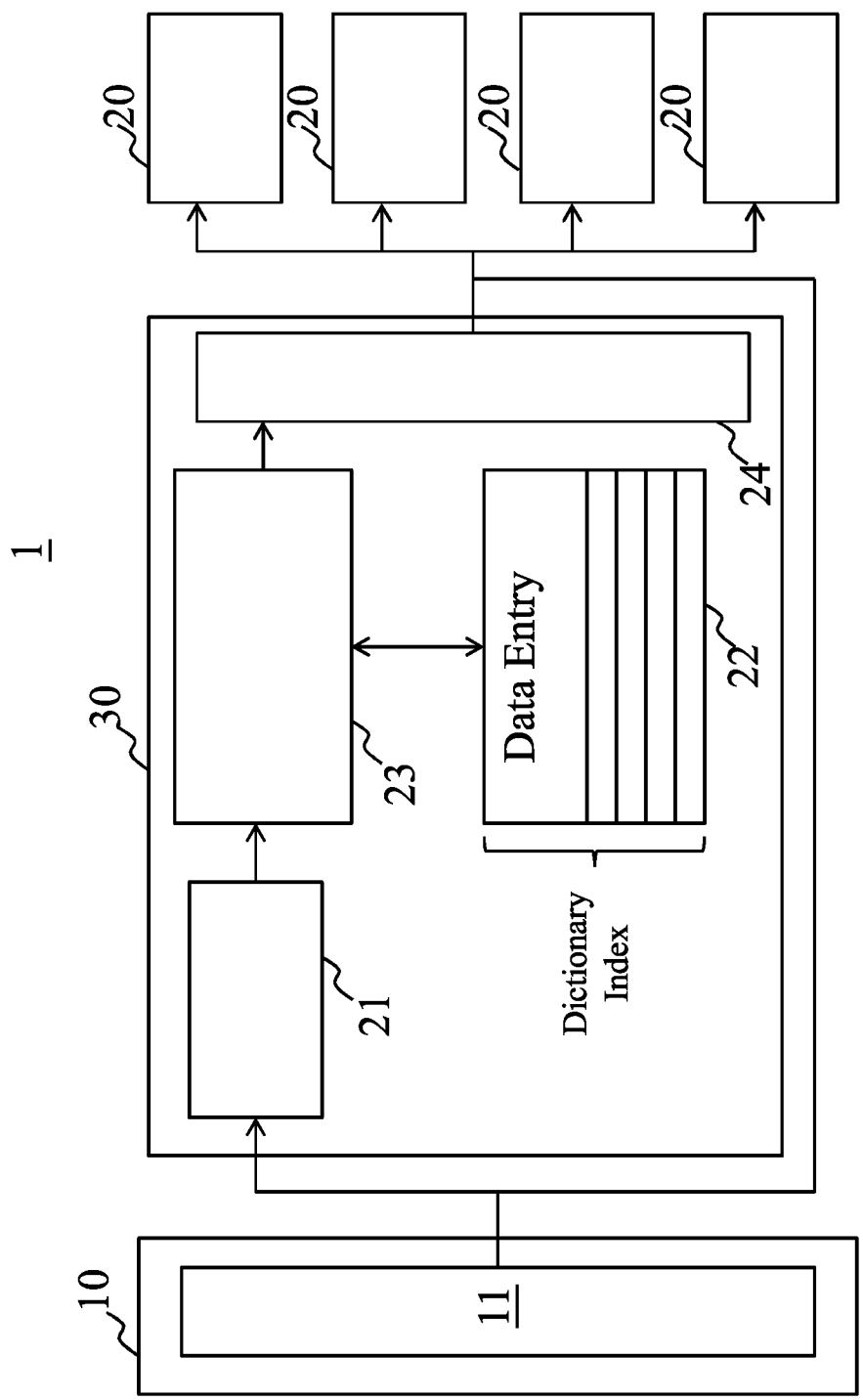
FIG. 1 is a block diagram of a prior art of a SSD architecture.
Figure 2:
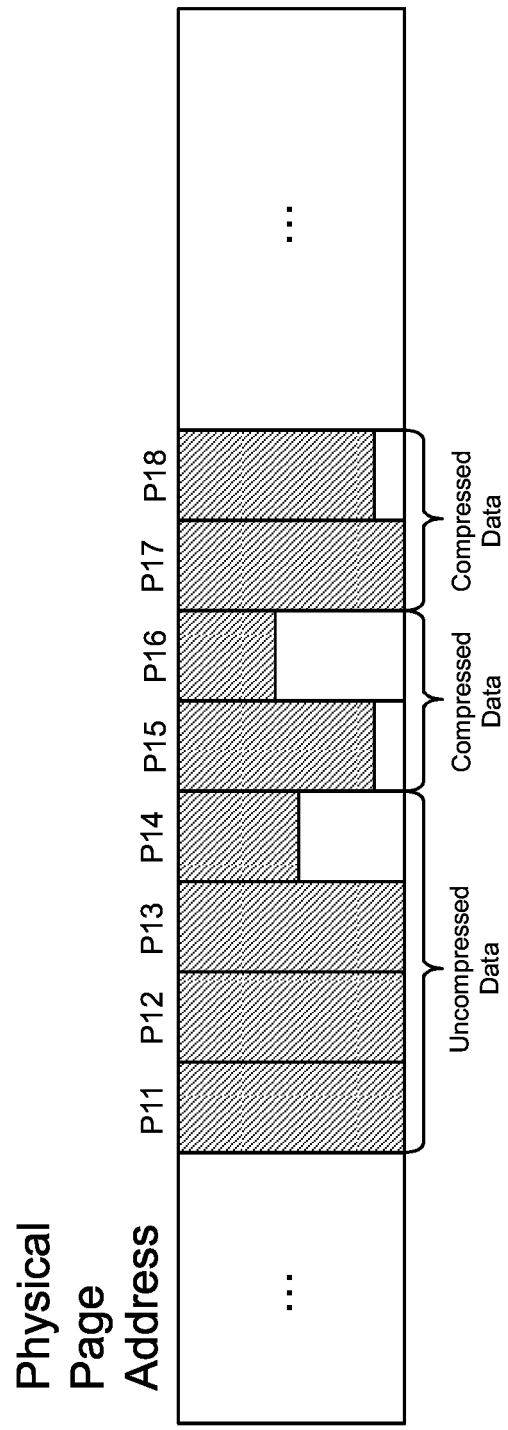
FIG. 2 shows consequent pages in the SSD.
Figure 3:
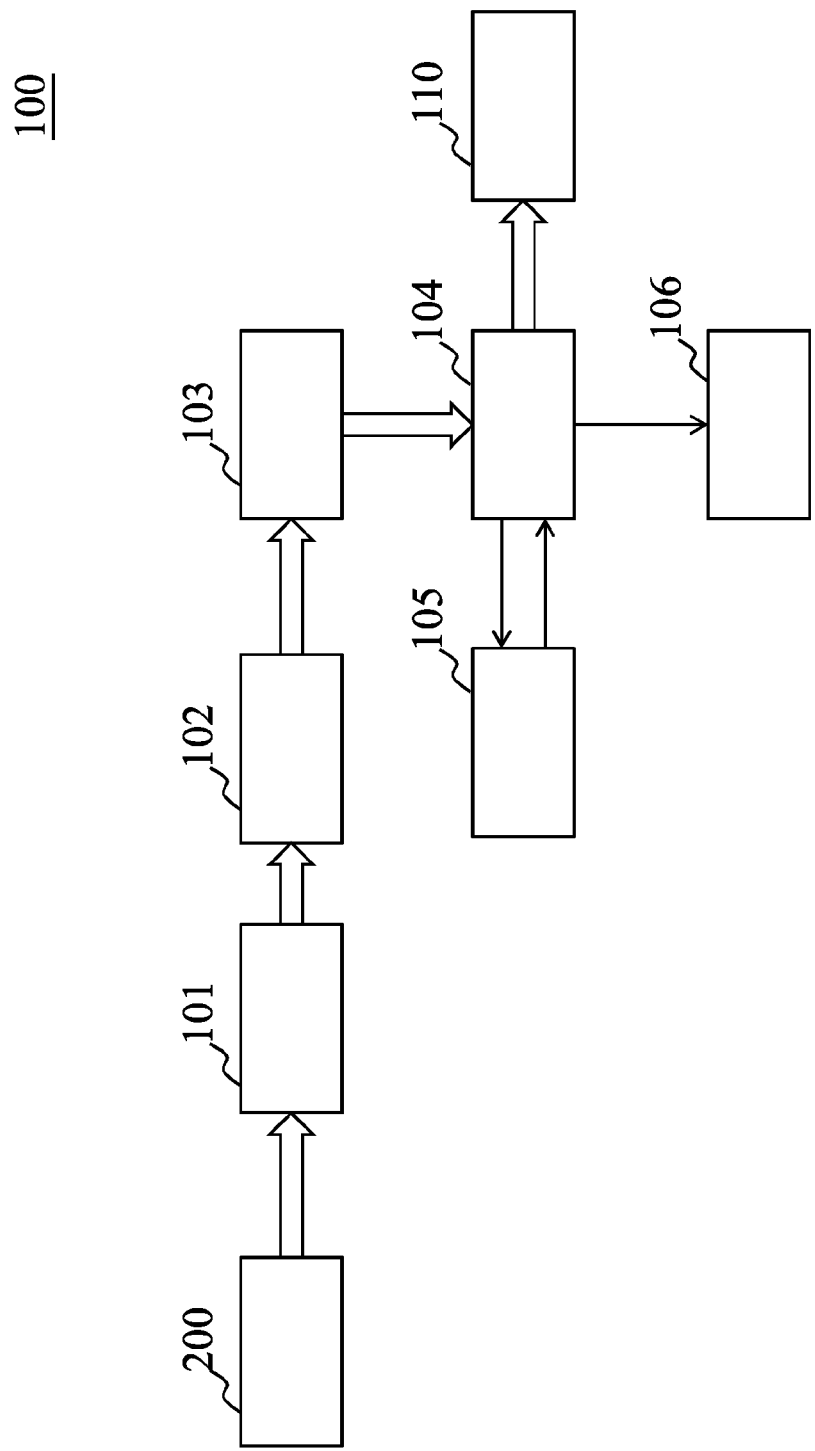
FIG. 3 is a block diagram of an adaptive compression data storing system in an embodiment according to the present invention.

Please refer to FIG. 3. An adaptive compression data storing system 100 for non-volatile memories according to the present invention is illustrated. Non-volatile memories, such as NAND flash memories, including Single-Level Cell (SLC) flash memories, Multi-Level Cell (MLC) flash memories, and Triple-Level Cell (TLC) flash memories, are applicable to the present invention. In addition, the modularized non-volatile memories, e.g. Solid-State Drives (SSDs), memory cards and pen drives, are also applied. However, the non-volatile memories (or module) must be programmed by pages. Non-volatile memories which are able to randomly access, for example, Electrically Erasable Programmable Read Only Memories (EEPROM), are not applicable. For illustration purpose, a non-volatile memory 110 used in the present embodiment is a NAND flash chip. There are many kinds of NAND flash chips with different specifications can be available in the market. All of them can be used no matter how large the memory capacity or the page is. Here, focus of the present invention is on the interaction with pages in the non-volatile memory 110. As one may know that commonly used size of one page ranges from 512 B to 4 KB (only in the data area, not including the memory capacity in the spare area). In order to have a better understanding of the present invention, the page size is 2 KB.

Figure 4:
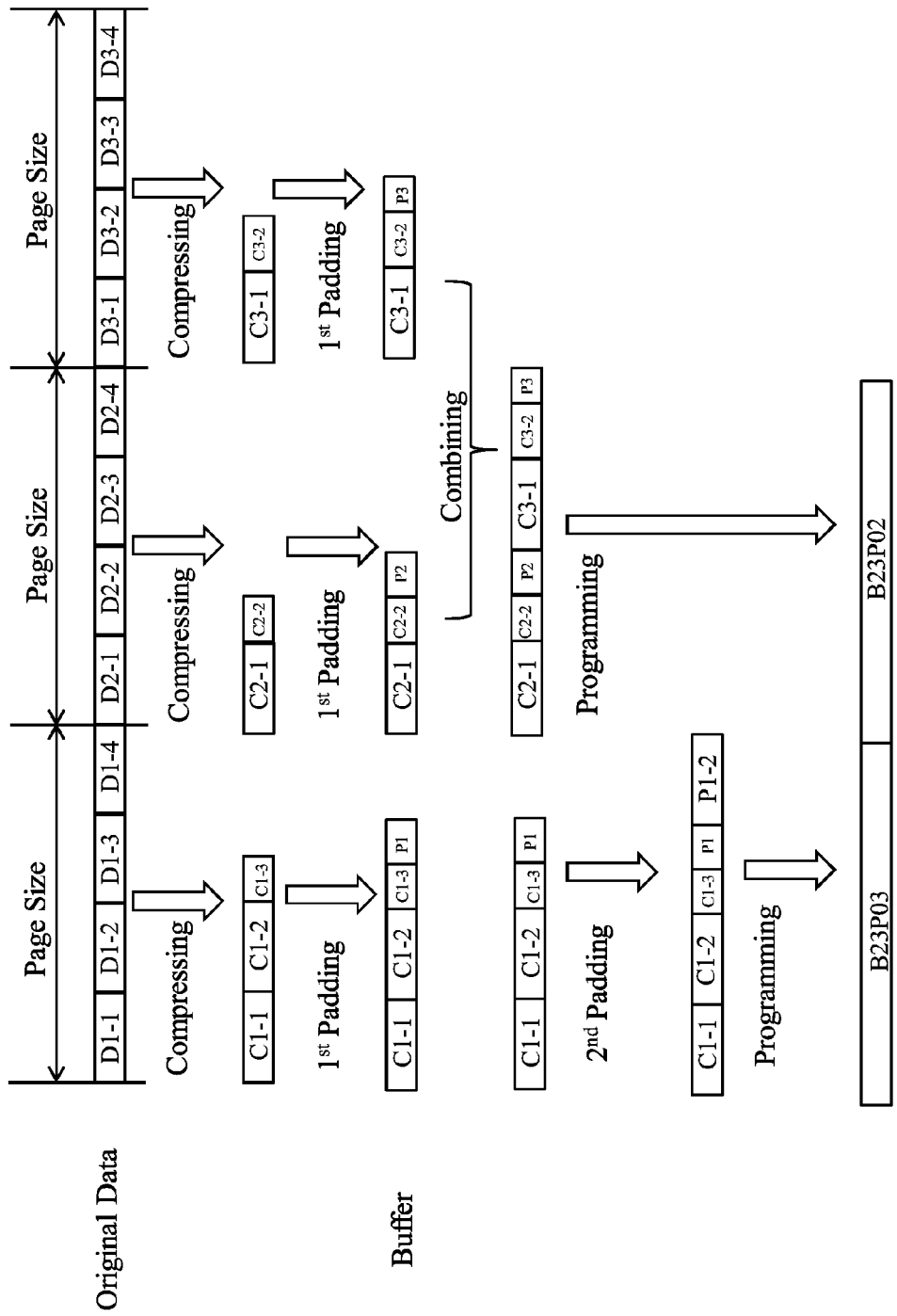
FIG. 4 illustrates data storing in the adaptive compression data storing system in the embodiment.

The adaptive compression data storing system 100 includes several parts: a host interface unit 101, a data compressor 102, a padding unit 103, a buffer 104, a combining unit 105 and a mapping table unit 106. The host interface unit 101 can communicate with a host 200 and receive first data from the host 200. The host 200 is a Central Processing Unit (CPU) of a personal computer. It writes data to the non-volatile memory 110 and read stored data therefrom. In practice, the host 200 may also be a standalone electronic device requesting for data storing, for example, a laptop computer. The host interface unit 101 can be designed to have suitable interface for the host 200. The interface may conform to Inter-Integrated Circuit (I2C) specification in this embodiment. Each of the first data from the host 200 has a size not greater than the size of a page (2 KB) in the non-volatile memory 110. Continuously received first data form an original data which needs to be stored in the non-volatile memory. The original data, e.g. an image file, may not be an integral multiple of 2 KB. A short original data may have data length of 500 B which occupies one page. A larger original data may have data length more than 10 MB and will have a last portion shorter than 2 KB after divided into several pages. The aforementioned two original data are all applicable to the adaptive compression data storing system 100. In this embodiment, an original data with 6 KB (3 times as a page size) is used for illustration. Other original data with different data length will be described in other embodiments. In this case, there are three first data of the original data are received as shown in FIG. 4. Each of the first data has a size of 2 KB. The first data of the original data can be obtained after the original data is received and divided. It is also workable to receive the original data with one first data after another. It depends on the design of the host interface unit 101 and is not limited by the present invention. The latter is applied in this embodiment.

The data compressor 102 is electrically connected to the host interface unit 101. It divides each first data into four basic units. Each basic unit has the same size. As shown in FIG. 4, a first data which is received firstly has basic units D1-1, D1-2, D1-3 and D1-4. A first data which is received secondly has basic units D2-1, D2-2, D2-3 and D2-4. A first data which is received last has basic units D3-1, D3-2, D3-3 and D3-4. It is obvious that all of the basic units are 512 B. 512 B is set to be a predetermined size. Based on different page size and number of basic units in one page, the predetermined size varies. According to the present invention, the number of the basic units in the first data is not limited to four. It can be more or be less than four but at least two is required if the size of the first data is greater than the predetermined size. Thus, at least one of the basic units is equal to the predetermined size. However, this embodiment introduces an ideal situation. If the length of the original data or the last portion of the original data (last first data in sequence) is shorter than one page, only one of the basic units of the first data is not greater than the predetermined size while the remainders are equal to the predetermined size. The data compressor 102 can compress the basic units. There are many algorithms for data compression can be used. Preferably, a lossless compression algorithm is recommended to use for compressing the basic units. In the embodiment, algorithm of LZ77 is applied. In practice, the lossless compression algorithm of LZSS, LZH, LZB, LZ78, LZW or LZFG can also be used.

Results of compression are illustrated below. D1-1 and D1-2 are uncompressible. The compressed basic units C1-1 and C1-2 are the same as D1-1 and D1-2, respectively. Basic units D1-3 and D1-4 have high compression ratio, therefore, they are compressed as another compressed basic unit C1-3. D2-1 to D2-4 are highly compressible and the compressed basic unit for basic units D2-1 and D2-2 is C2-1 and for basic units D2-3 and 2-4 is C2-2. Similarly, D3-1 to D3-4 are also highly compressible and the compressed basic unit for basic units D3-1 and D3-2 is C3-1 and for basic units D3-3 and 3-4 is C3-2.

The padding unit 103 is electrically connected to the data compressor 102. It can connect and pad the compressed basic units to form one second data. The second data has a size as an integral multiple of the predetermined size, for example, 1 KB or 1.5 KB. In an extreme case, compression ratio is 0. The size of the second data can be the same as one page. Please see FIG. 4 again. The compressed basic units C1-1, C1-2 and C1-3 are connected and padded (or appended) with a padding P1. The compressed basic units C2-1 and C2-2 are connected and padded with a padding P2. The compressed basic units C3-1 and C3-2 are connected and padded with a padding P3. 0 is used as an element for padding. It means that the padding P1, P2 and P3 are all composed of a number of 0. In the extreme case mentioned above, padding process still work but no "0" is appended after the end of the connected and compressed basic units. The compressed basic units are identical to the corresponding received first data. This is called $1^{st}$ padding as shown in FIG. 4.

The padding unit 103 can pad the second data, connected and padded the second data as a third data if the original data has been received completely. The second data is stored in the buffer 104. As shown in FIG. 4, the second data composed of C1-1, C1-2, C1-3 and P1 (named second data 1 hereinafter) is further padded with a padding P1-2 (P1-2 are all "0"s). This is called $2^{nd}$ padding as shown in FIG. 4. The third data has the same size as a page and can be programmed to one page (B23P03) in the non-volatile memory 110. This is the last stage to store the original data. Since there is no more second data to combine (this will be illustrate later), the rest of second data in the buffer 104 will be padded (or connected and padded) and programmed to the page at once. If there are more than one second data in the buffer 104, as long as the total size is smaller than the size of one page, they will be connected, padded and programmed.

The buffer 104 is electrically connected with the padding unit 103 and the non-volatile memory 110. It can temporarily store the second data. If the buffer 104 is full or substantially full, it can replace one stored second data with a new second data. However, this job is done with assistance of the padding unit 103. The padding unit 103 pads one second data which has the largest size among all second data in the buffer 104 as one third data when the buffer 104 is full or substantially full (for example, no space of one predetermined size is left) and no combination of the second data has the size as one page. The padded second data (third data) will be programmed to the non-volatile memory 110. At this moment, another second data will be stored in the buffer 104. For example, if the buffer 104 is set to have as size of 4 KB (2-page size), the second data 1 and the second data composed of C2-1, C2-2 and P2 (named second data 2 hereinafter) can not have a size of one page after been combined, the second data 1 has the largest size will be replaced by the second data composed of C3-1, C3-2 and P3 (named second data 3 hereinafter). Thus, the second data 2 and the second data 3 can be combined to meet the size of one page. For this, there should be at least two second data left in the buffer 104. The new second data may have different size as the programmed one and combining of at least two second data (will be described later) can keep going on. The replaced second data can also be one which stays longer than other second data in the buffer 104. The two methods mentioned above can both be a way to settle the problem of buffer full.

Size of the buffer 104 can be an integral multiple of the predetermined size. It should be larger than 4 times as the predetermined size. The size of the buffer 104 is not limited in the present invention but, preferably, it is at least 8 times of the predetermined size in case two first data are received but the buffer 104 is full. In addition to some logic circuit for control, the buffer 104 can comprise a Dynamic Random Access Memory (DRAM) or a Static Random-Access Memory (SRAM). DRAMs or SRAMs are often used as a buffer. Further, the buffer 104 can program the third data to a specific page in the non-volatile memory 110. When the third data is programmed to the non-volatile memory 110, a portion of the original data is stored.

The combining unit 105 is electrically connected with the buffer 104, for combining at least two of the second data in the buffer 104 as a third data. Please see FIG. 4. When dealing with the second data padded with padding P2 and the one padded with padding P3, the combining unit 105 finds that these two second data in the buffer 104 can have a size of one page (four times as the predetermined size), the two second data are combined as the third data and then be programmed to the non-volatile memory 110. The combination can be four second data with a size of one predetermined size. It can be two second data that one is three times as the predetermined size while the other just has a predetermined size. Of course, if one page contains basic units more than four, the aspects of combination will be diverse.

It should be noticed that if the size of the first data is not greater than the predetermined size while no other second data is in the buffer 104, the first data received will not be divided but be compressed, padded to a size of one page and programmed to the non-volatile memory 110. This situation occurs only if the original data is shorter than the predetermined size or the last first data of the original data is received while no other second data is left in the buffer 104.

The mapping table unit 106 is electrically connected to the buffer 104. It stores and updates a mapping connection in a mapping table for a physical page address of the specific page and a logical address of the original data. Please refer to FIG. 4. If the logical address of the image file (original data) to be stored is at URL: e:\data\image.jpg, the corresponding physical page address will be B23P03 (page 3 of block 23) and B23P02 (page 2 of block 23). More precisely, the first page size of the original data is compressed and stored in B23P03 while the rest part in B23P02. One page is saved this way. For current device in the market which has other compression algorithm applied, three pages are still required because no "combination" is processed to utilize unused space in one page. The mapping table unit 106 can be an Electrically-Erasable Programmable Read-Only Memory (EEPROM) or another NAND flash chip but with smaller size than the non-volatile memory 110.

Figure 5:
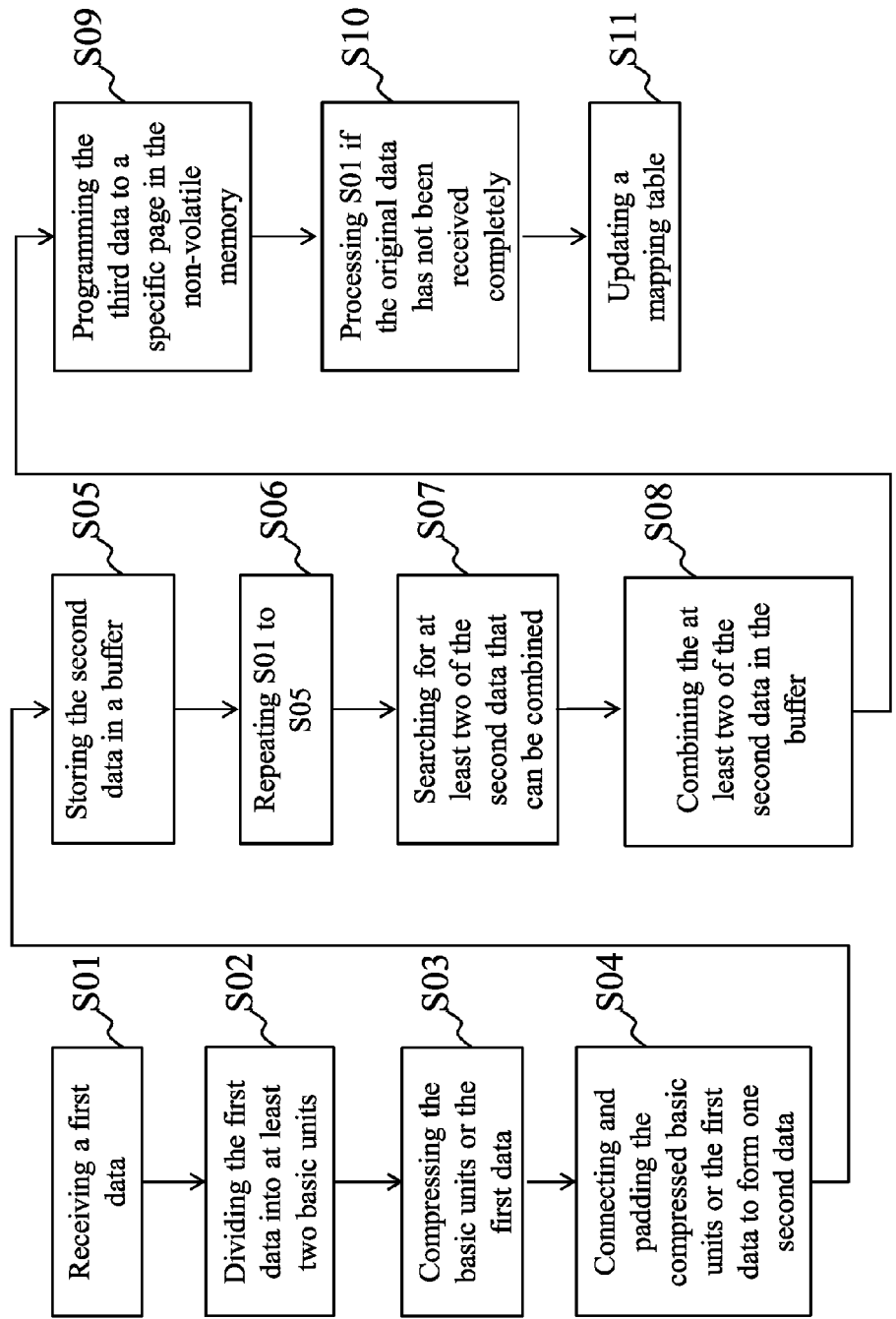
FIG. 5 is a flow chart of an adaptive compression data storing method in the embodiment according to the present invention.

An adaptive compression data storing method for non-volatile memories by using the adaptive compression data storing system 100 is illustrated on a flow chart in FIG. 5. Please refer FIG. 5 and FIG. 4 at the same time. The data compressor 102 receives a first data (containing basic units of D1-1 to D1-4, named first data 1 hereinafter) from the host interface unit 101 (S01). After the first data 1, a first data 2 (containing basic units of D2-1 to D2-4) and a first data 3 (containing basic units of D3-1 to D3-4) will be received in sequence. It should be noticed that the size of the first data 1, 2 and 3 is equal to the size of a page in the non-volatile memory 110 as mentioned above. Continuously received first data 1, 2 and 3 form an original data which needs to be stored in the non-volatile memory 110. Then, the data compressor 102 divides the first data 1 into four basic units if the size of the first data is greater than the predetermined size, 512 B (S02). In S02, at least two basic units are required. The data compressor 102 also compresses the basic units D1-1 to D1-4 (S03). The padding unit 103 takes over the basic units D1-1 to D1-4. It connects and pads the compressed basic units D1-1 to D1-4 to form the second data 1 so that the second data 1 has a size as an integral multiple of the predetermined size (S04). Next, the second data 1 is stored in the buffer 104 (S05). For illustration, size of the buffer 104 is set to be 3 KB.

Repeat S01 to S05 if the number of second data is 1 and the original data has not been received completely (S06). It means there should be at least two second data for the combining unit 105 to combine. After repeating the steps, the first data 2 is obtained and the second data 2 is created. The next step, searching for at least two of the second data that can be combined to have a size of one page in the buffer 104 by the combining unit 105 (S07). If it can not be available due to the size of the combined second data 1 and second data 2 is over one page, there should be another second data (second data 3) to processing S07. Therefore, S07, S08 and S09 are skipped. Process S01 again when the original data has not been received completely. Thus, the first data 3 is obtained and the second data 3 is created. Following S07, the second data 2 and second data 3 are found to be combinable. The combining unit 105 combines the second data 2 and second data 3 in the buffer 104 as a third data. It should be noticed that that original data is not large so that it is completely received at this moment. However, for a larger original data to be stored, the combining process is carried on when that original data has not been received completely. Meanwhile, the number of second data to be combined is not limited to two. It should be at least two. The third data comprised of the second data 2 and second data 3 is first programmed to a specific page (B23P02) in the non-volatile memory 110 first. Then, the second data 1 is padded and programmed to another specific page (B23P03) in the non-volatile memory 110 if the original data has been received completely (S10). As mentioned above, 0 is used as an element for padding.

In fact, S01 to S10 should be repeated until the original data is completely received. After the original data is stored, the mapping table unit 106 updates a mapping table inside (S11). In S11, a mapping connection for a physical page address of the specific pages (B23P02 and B23P03) and a logical address of the original data is stored.

If the size of the buffer 104 is smaller, for example 2 KB, the second data 3 can not exist with the second data 1 and second data 2. According to the present invention, there are two ways to settle this problem. First, add a step S08' after S08 that padding one second data which has the largest size (second data 1) among all second data in the buffer 104 as the third data if the buffer 104 is full or substantially full and no combination of the second data has the size as one page and programming the third data to a specific page in the non-volatile memory 110. Second, add a step S08" after S08 that padding one second data which stays longer (second data 1) than other second data in the buffer 104 as the third data if the buffer 104 is full or substantially full and no combination of the second data has the size as one page and programming the third data to a specific page in the non-volatile memory 110. Similarly, 0 is used as the element for padding.

In this embodiment, the original data is just has a size of 3 pages. In another embodiment, the size of one original is not an integral multiple of one page. According to the present invention, some steps will change.

Figure 6:
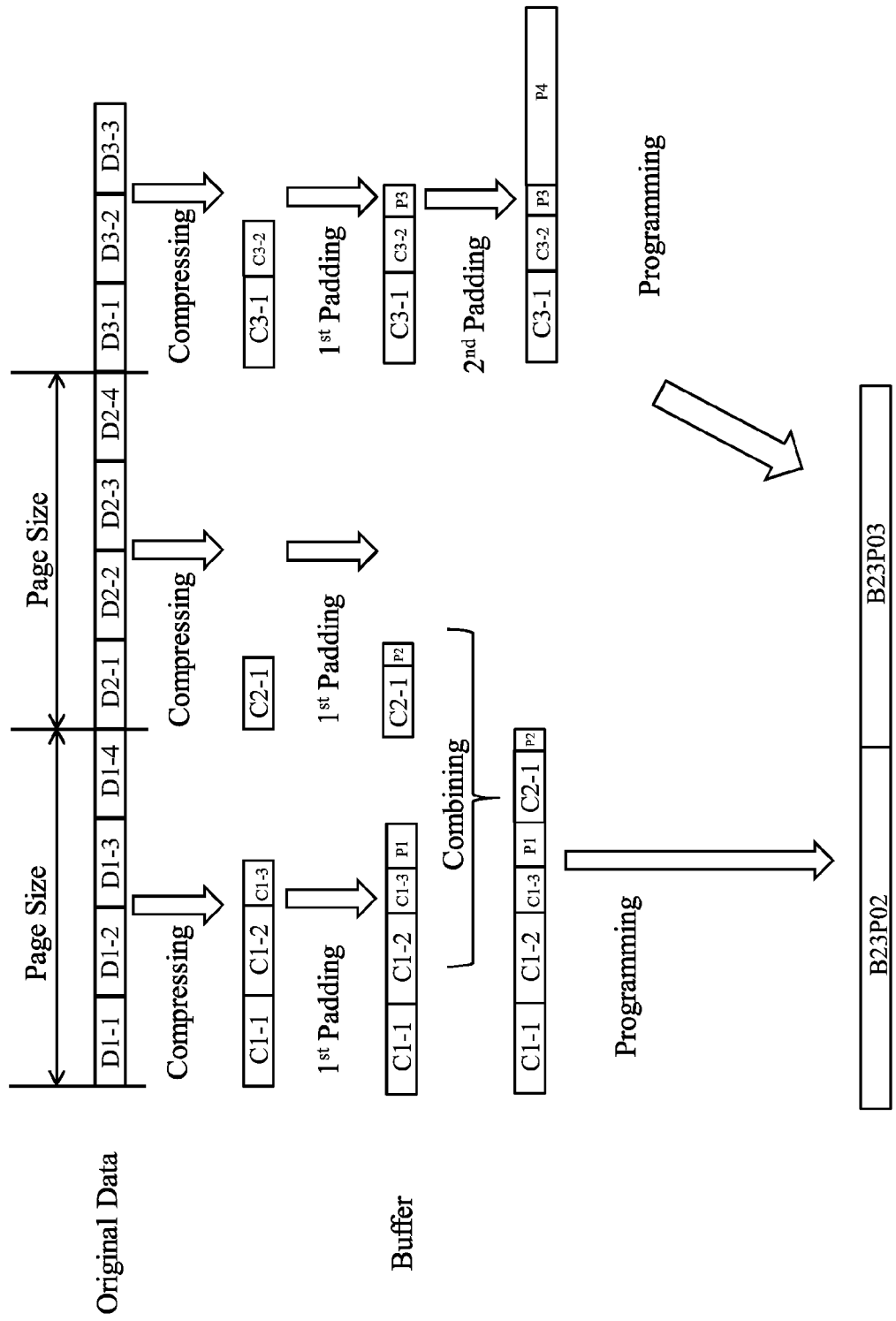
FIG. 6 illustrates data storing in the adaptive compression data storing system in another embodiment.

Please see FIG. 6. Some elements are utilized from FIG. 5. Differences between the two embodiments are remarked as below. First, the original data is 5.5 KB, 512 B less than that in the previous embodiment. Therefore, the first data 3 (including basic units D3-1 to D3-3) is not a full-page size (requested that at least one of the basic units is equal to the predetermined size). Second, the first data 2 has higher compression ratio. Basic units D2-1 to D2-4 can be compressed to C2-1 only and padded with padding P2 as the second data 2. The first data 1 and second data 2 are not changed.

Hence, in S07, the second data 1 and second data 2 will first be combined and then programmed to B23P02. Since there is no more first data comes after the first data 3, the second data 3 will be padded again with padding P4 and programmed to B23P03 in S09. Under this condition, S10 will be skipped and S11 will be performed.

In other embodiment, if the original data is larger and two or more second data are left when the original data is received completely, in S07, the second data will be connected and padded in the buffer 104 as a third data. Similarly, S10 will be skipped and S11 will be performed.

In the extreme case, the original data is too short that the size of the original data is not greater than the predetermined size. The first data (only one) will not be divided but be compressed and padded to a size of one page and programmed to the non-volatile memory 110. Only S01, S04, S05, S08, S09 and S11 are processed. The rest are not processed since the requirements for the steps are not complied.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. An adaptive compression data storing method for non-volatile memories, comprising the steps of:
    A. receiving a first data which is divided from an original data that is to be stored in the non-volatile memory, wherein a size of the first data is not greater than that of a page in a non-volatile memory and the original data is formed by a plurality of first data that is continuously received;
    B. dividing the first data into at least two basic units if the size of the first data before being compressed is greater than a predetermined size, wherein at least one of the basic units before being compressed is equal to the predetermined size;
    C. compressing the basic units or the first data;
    D. connecting and padding the compressed basic units or the compressed first data to form a second data so that the second data has a size as an integral multiple of the predetermined size;
    E. storing the second data in a buffer;

F. repeating step A to step E until each of the plurality of the first data which forms the original data is received, wherein a plurality of second data is formed while step A to step E are repeated;

G. searching for at least two of the second data that can be combined to have a size of one page in the buffer;

H. combining the at least two of the second data in the buffer as a third data, or padding the second data or connecting and padding the second data in the buffer as a third data if each of the plurality of the first data which forms the original data is received, wherein a size of the third data is the same as that of one page;

I. programming the third data to a specific page in the non-volatile memory; and J. processing step A if not every one of the plurality of the first data which forms the original data is received, wherein 0 is used as an element for padding.

2. The adaptive compression data storing method according to claim 1, further comprising a step I1 after the step I:
I1. updating a mapping table where a mapping connection for a physical page address of the specific page and a logical address of the original data is stored.

3. The adaptive compression data storing method according to claim 1, further comprising a step H1 between the step H and the step I: H1. padding one of the second data which has the largest size among all of the second data in the buffer as the third data if the buffer is full and no combination of the second data has the size as one page and programming the third data to a specific page in the non-volatile memory, wherein 0 is used as an element for padding.

4. The adaptive compression data storing method according to claim 1, further comprising a step H2 between the step H and the step I: H2. padding one of the second data which stays longer than other second data in the buffer as the third data if the buffer is full and no combination of the second data has the size as one page and programming the third data to a specific page in the non-volatile memory, wherein 0 is used as an element for padding.

5. The adaptive compression data storing method according to claim 1, wherein a lossless compression algorithm is used in the step C for compressing the first data or the basic units.

6. The adaptive compression data storing method according to claim 5, wherein the lossless compression algorithm is LZ77, LZSS, LZH, LZB, LZ78, LZW or LZFG.

7. The adaptive compression data storing method according to claim 1, wherein the non-volatile memory is a NAND flash or a Solid-State Drive (SSD).

8. The adaptive compression data storing method according to claim 1, wherein one basic unit is compressed to form a compressed basic unit or at least two basic units are compressed to form a compressed basic unit.

9. An adaptive compression data storing system for non-volatile memories, comprising:
a host interface unit, for communicating with a host and continuously receiving a first data which is divided from an original data that is to be stored in the non-volatile memory, wherein the first data has a size not greater than that of a page in a non-volatile memory from the host, and the original data is formed by a plurality of the first data that is continuously received;
a data compressor, electrically connected to the host interface unit, for dividing each first data into at least two basic units if the size of the first data before being compressed is greater than a predetermined size, wherein at least one of the basic units before being compressed is equal to the predetermined size; and for compressing the basic units;
a padding unit, electrically connected to the data compressor, for connecting and padding the compressed basic units to form a second data, and padding the second data or connecting and padding the second data as a third data if each of the plurality of the first data which forms the original data is received;
a buffer, electrically connected with the padding unit and the non-volatile memory, for temporarily storing the second data, replacing one of the stored second data when it is full, and programming the third data to a specific page in the non-volatile memory;
and a combining unit, electrically connected with the buffer, for combining at least two of the second data in the buffer as a third data,
wherein if the size of the original data before being compressed is not greater than the predetermined size, the first data will not be divided but be compressed and padded to a size of one page and programmed to the non-volatile memory; the second data has a size as an integral multiple of the predetermined size; the third data has a size the same as that of one page; 0 is used as an element for padding.

10. The adaptive compression data storing system according to claim 9, further comprising a mapping table unit, electrically connected to the buffer, for storing and updating a mapping connection in a mapping table for a physical page address of the specific page and a logical address of the original data.

11. The adaptive compression data storing system according to claim 9, wherein the padding unit further pads one of the second data which has the largest size among all of the second data in the buffer as the third data if the buffer is full and no combination of the second data has the size as one page.

12. The adaptive compression data storing system according to claim 9, wherein the padding unit further pads one of the second data which stays longer than other second data in the buffer as the third data if the buffer is full and no combination of the second data has the size as one page.

13. The adaptive compression data storing system according to claim 9, wherein a lossless compression algorithm is used for compressing the first data or the basic units.

14. The adaptive compression data storing system according to claim 13, wherein the lossless compression algorithm is LZ77, LZSS, LZH, LZB, LZ78, LZW or LZFG.

15. The adaptive compression data storing system according to claim 9, wherein the non-volatile memory is a NAND flash or a Solid-State Drive (SSD).

16. The adaptive compression data storing system according to claim 9, wherein the buffer comprises a Dynamic Random Access Memory (DRAM) or a Static Random-Access Memory (SRAM).

17. The adaptive compression data storing system according to claim 9, wherein one basic unit is compressed to form a compressed basic unit or at least two basic units are compressed to form a compressed basic unit.

* * * * *